(12) United States Patent
Feist et al.

(10) Patent No.: US 7,898,822 B2
(45) Date of Patent: Mar. 1, 2011

(54) HOLDER FOR ELECTRIC COMPONENTS

(75) Inventors: Günter Feist, Gingen/Fils (DE); Klaus Zimmermann, Gerstetten (DE)

(73) Assignee: EPCOS AG, Munich (DE)

( * ) Notice: Subject to any disclaimer, the term of this patent is extended or adjusted under 35 U.S.C. 154(b) by 771 days.

(21) Appl. No.: 11/659,440

(22) PCT Filed: Jul. 1, 2005

(86) PCT No.: PCT/DE2005/001167
§ 371 (c)(1),
(2), (4) Date: Mar. 1, 2007

(87) PCT Pub. No.: WO2006/012822
PCT Pub. Date: Feb. 9, 2006

(65) Prior Publication Data
US 2007/0285911 A1 Dec. 13, 2007

(30) Foreign Application Priority Data
Aug. 4, 2004 (DE) .................. 10 2004 037 844

(51) Int. Cl.
*H05K 7/18* (2006.01)
(52) U.S. Cl. .................. 361/836; 361/811; 361/821; 336/65; 336/90
(58) Field of Classification Search .................. 361/811, 361/821, 836; 336/65.9
See application file for complete search history.

(56) References Cited

U.S. PATENT DOCUMENTS 4,263,479 A  4/1981 Lange et al.
5,309,130 A * 5/1994 Lint .............................. 336/65
5,719,547 A * 2/1998 Kaneko et al. .............. 336/180
5,789,712 A * 8/1998 Barry et al. ............. 174/138 G
5,986,894 A * 11/1999 Lint et al. .................... 361/813
6,031,442 A * 2/2000 Nakazawa ..................... 336/96
6,081,180 A * 6/2000 Fernandez et al. ............ 336/90
6,757,180 B1  6/2004 Chiang et al.
6,877,211 B2 * 4/2005 Machado .................... 29/602.1
7,002,074 B2 * 2/2006 Settergren et al. ........... 174/535
7,071,803 B2 * 7/2006 Oki ............................. 336/83

FOREIGN PATENT DOCUMENTS

| CA | 2 327 796 | 10/1999 |
| DE | 854 382 | 11/1952 |
| DE | 33 18 527 | 11/1984 |
| DE | 36 02 759 | 8/1987 |
| DE | 94 12 107.9 | 11/1994 |
| DE | 198 15 852 | 10/1999 |
| DE | 203 09 223 | 10/2003 |
| EP | 0 468 314 | 1/1992 |
| JP | 01-115224 | 8/1989 |
| JP | 3-50807 | 3/1991 |
| JP | 05-041110 | 6/1993 |
| JP | 08-017642 | 1/1996 |

OTHER PUBLICATIONS

International Search Report for PCT/DE2005/001167.

(Continued)

*Primary Examiner* — Dameon E Levi
(74) *Attorney, Agent, or Firm* — Fish & Richardson P.C.

(57) ABSTRACT

A holder holds an electrical component having wire ends that act as electrical connections. The holder includes a body having a center part. The center part has a recess for holding the component. Side walls of the recess have slots for guiding wire ends of the component. The recess and the slots are open at a same side of the body.

17 Claims, 2 Drawing Sheets

OTHER PUBLICATIONS

Written Opinion for PCT/DE2005/001167.
International Preliminary Report on Patentability in Application No. PCT/DE2005/001167, dated Mar. 1, 2007 (English translation).
Written Opinion of the International Searching Authority in Application No. PCT/DE2005/001167 (English translation).
English Translation of Notification for Reasons for Refusal in counterpart Japanese Application No. 2007-0524163, dated Jun. 4, 2010.
Machine Translation of Claim 1 in Japanese Publication No. 05-041110; (Pub. Date Jun. 1, 1993).
English language description of Figure 2 in Japanese Publication No. 1-115224; (Pub. Date Aug. 3, 1989).
English language description of Figure 1 in Japanese Publication No. 5-041110 (Pub. Date Jun. 1, 1993).

* cited by examiner

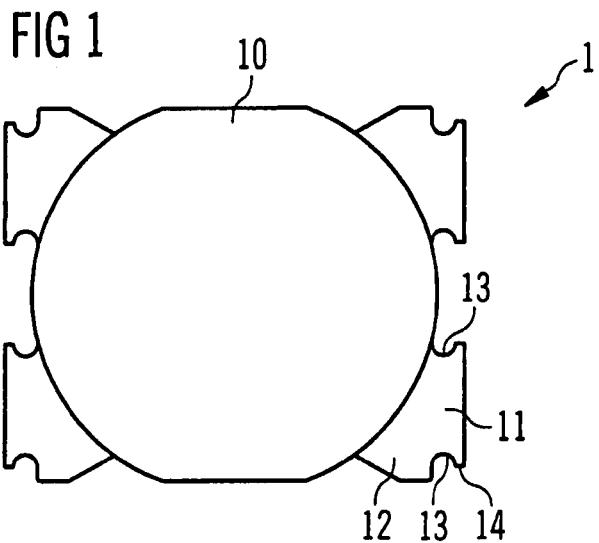
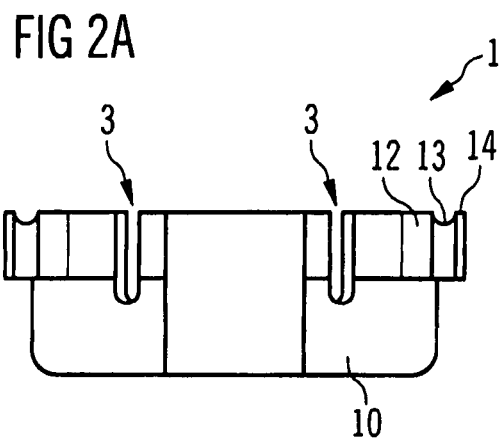 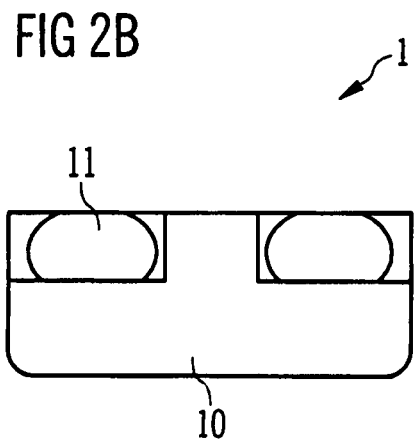
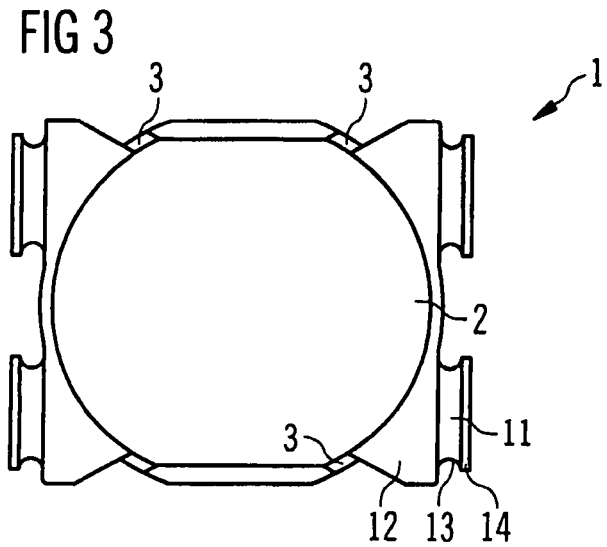

HOLDER FOR ELECTRIC COMPONENTS

TECHNICAL FIELD

This patent application relates to a holder for an electrical component, e.g., a toroidal-core inductor, and also to a component containing the electrical component and the holder.

BACKGROUND

The following publications describe holders for toroidal-core inductors with plug or connection pins anchored in the holder body, and devices for isolating voltages of different toroidal-core inductor wire windings: DE3318527A1, DE9412107U1, and EP0468314B1.

U.S. Pat. No. 5,309,130 describes a component with a toroidal-core inductor suitable for surface mounting, which includes two wire windings and a holder. The holder has a recess in which the toroidal-core inductor is mounted. Projections for winding ends of the wire windings are on the body of the holder. Openings, through which the wire ends are guided loosely, are in a wall of the recess. The wire ends are attached to corresponding projections. During fabrication of such a component, it is difficult to automate passing the wire ends through the openings.

SUMMARY

This patent application describes an electrically insulating holder for holding an electrical component with wire ends. The wire ends are used as electrical connections for the component. The holder has a body with a center part in which a recess is formed for holding the component. Side walls of the recess have slots suitable for guiding wire ends of the component. Both the recess and the slots are open towards the same side of the body. This side is designated as the top side of the body.

Inserting the wire ends of the electrical component in the slots of the recess holding the component fixes the distance between different wire ends to the distance between the slots.

The holder can be used in a component with an electrical component, e.g., toroidal-core inductor. The electrical component can be, e.g., a toroidal-core inductor with a closed magnetic core and two different wire windings to be isolated from each other. The electrical component can be adhered to, or encased in, the recess.

The slot may be a longitudinal slot. The slot can also be at an angle to a longitudinal axis of the holder.

The width of the slot may be a function of a diameter of a wire end so that the wire end is held firmly, e.g., pinched, in the slot.

The recess may be a blind hole recess, that is, a recess with a closed base. In the component, on the outside the base of the recess forms a surface, which can be used, for example, for labeling the component and for handling using a vacuum gripper.

The cross section of the recess perpendicular to the longitudinal axis of the holder may correspond to the shape of the electrical component.

In an embodiment, the holder has first projections for winding wire ends. The first projections are on the side surfaces of the holder. A first projection can have a collar, which faces away from the body and whose surface runs perpendicular to a longitudinal axis of the first projection. A groove for guiding the wire end may be on the first projection.

When winding the wire ends onto first projections, contacts of the component are formed. A modular dimension between different wire ends need not be maintained (through additional measures). In this way, in particular, other connection elements, such as plug pins, encased, e.g., in the body of the holder, can be eliminated.

Second projections can be formed on the body, which are between the slots and the shoulder of grooves and which are used for guiding the wire ends. The second projections prevent slipping of each wire end towards the top.

The lowest point of a slot may be lower than a bottom edge of the first or the second projection (e.g., by a value corresponding to a wire diameter). The wire end is guided between the slot and corresponding first projection through the second projection essentially parallel to the base surface of the body.

The position of the first projection and the depth of the groove may be such that that a top edge of the wire end projects past a top surface of the body and forms an electrical contact suitable for surface mounting the component. The height of the recess may be such that the electrical component does not project past the top edge of the recess.

The holder may be comprised of a plastic. The center part and the first and second projections together may form a one-piece housing or sub-housing of the component.

Embodiments are explained in more detail below with reference to associated figures. The figures show different embodiments in terms of schematic and not-to-scale representations. Identical parts or parts with identical functions are designated with identical reference symbols.

DESCRIPTION OF THE DRAWINGS

FIG. 1, a view of a holder from below,

FIG. 2A, a front view of the holder according to FIG. 1,

FIG. 2B, a side view of the holder according to FIGS. 1, 2A,

FIG. 3, a view of the holder from above,

DETAILED DESCRIPTION

Figure 4:
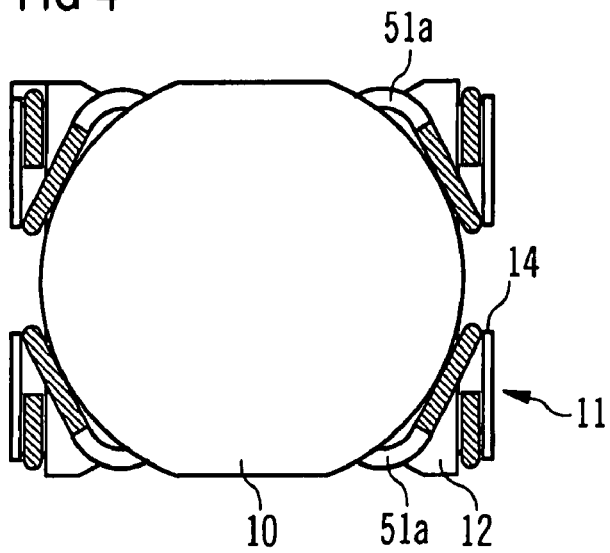
FIG. 4, a view of a component with the holder according to FIGS. 1-3 and a toroidal-core inductor from below, FIG. 5, a front view of the component according to FIG. 4 in a front view, and FIG. 6, a view of the component according to FIGS. 4, 5 from above.

FIGS. 1-3 show a holder for holding a toroidal-core inductor.

FIG. 1 shows a holder 1 with a body 10. The body 10 has a center part, which is used for holding an electrical component, e.g., toroidal-core inductor. The center part of the body 10 is essentially cylindrical. In the body 10, there are four first projections 11 and four second projections 12, which are each connected to the center part 10. The longitudinal axis of the first projections 11 runs parallel to the top side of the body 10. The first projections 11 are on opposing side surfaces of the body 10.

The projections 11 (or 12) have a mirror-image construction and are, in principle, identical. Below, only one first projection and one second projection corresponding to the first projection are described in detail. The description is applicable, however, to all of the first and second projections shown in the figures.

In the longitudinal section, the first projection 11 has a configuration of a coil body. The projection 11 has a collar 14 and also a groove 13 for guiding a wire end 51*a*.

In the side wall of the center part of the body 10 there are slots 3 (FIG. 2A). The slots 3 are open towards the top side of the body 10. Also, the recess 2 is open towards the top side of the body 10.

In FIG. 2B, the top edge of the first projection 11 runs parallel to the top side of the body 10. Therefore, a contact of the component running parallel to the top side of the body 10, and suitable for surface mounting, can be implemented in a component with the holder 1 (FIG. 6).

Figure 5:
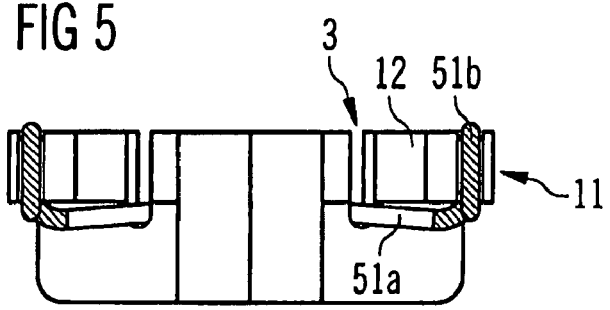
Figure 6:
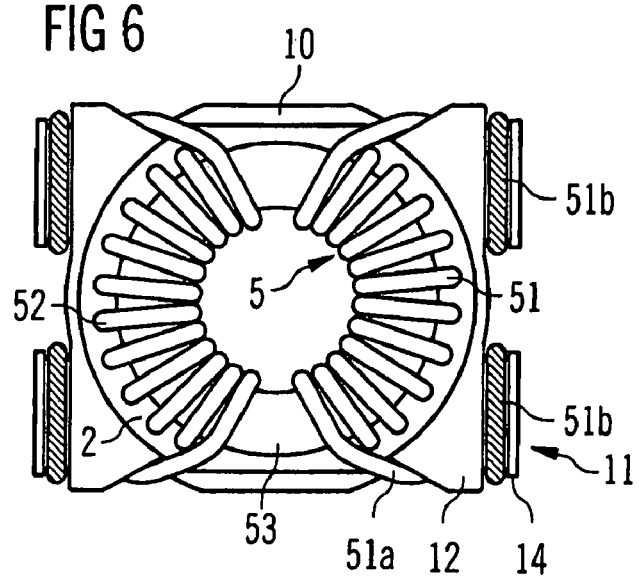

In FIGS. 4-6, a component is shown with the holder 1 and a toroidal-core inductor 5. The toroidal-core inductor 5 is in the recess 2 of the body 10. A height of the toroidal-core inductor does not exceed the depth of the recess 2.

The recess 2 is cylindrical. The toroidal-core inductor 5 has a closed magnetic core 53 and also two wire windings 51, 52. The wire end 51a of the wire winding 51 is first inserted into the slot 3 from above and then guided underneath the second projection 12 towards the first projection 11. The second projection 12 prevents slippage of the wire end 51a towards the top. The wire end 51 is wound around the first projection 11. The component contact 51b of the component is formed by an area of the wire end 51a projecting past the top side of the body 10.

The component is mounted on a circuit board with its top side (shown in FIG. 6) downwards or towards the circuit board. The component contacts 51b are soldered with connection areas of the circuit board that are provided for this purpose.

The wire end 51a is guided in the groove 13 when wrapping around the first projection 11. The collar 14 is also used for guiding the wire end 51a. A part of the wire end 51a is tin-plated. This is shown in FIGS. 4-6 with shading.

In FIG. 5, the depth of the slot 3 and the height of the bottom edge of the first and second projection 11, 12 are such that the wire end 51a is guided up to its insertion into the groove 13 essentially parallel to the top side of the body 10. The width of the slot 3 is adapted to the cross-sectional size of the wire end 51a for a positive-fit connection. The wire end may be pinched in the slot 3.

The claims are not limited to the embodiments shown here or to a certain selection of materials. The presented elements can be combined with each other in any number and arrangement. The slot can be replaced, in principle, by any one-sided open recess, e.g., a notch or a groove.

The invention claimed is:

1. A holder for holding an electrical component comprising wire ends that act as electrical connections, the holder comprising:
 a body comprising a center part, the center part comprising a recess for holding the electrical component, the recess comprising side walls, the side walls comprising slots for guiding wire ends of the electrical component;
 first projections for winding wire ends, the first projections being on side surfaces of the body; and
 second projections on the body between the slots and the first projections, the second projections for guiding wire ends;
 wherein the recess and the slots are open at a same side of the body; and
 wherein the body comprises a base, the base being an undivided part of the body and being on a different side of the body than the recess and the slots.

2. The holder of claim 1, wherein a longitudinal axis corresponding to at least one of the first projections is substantially parallel to a plane containing a top side of the body.

3. The holder of claim 1, wherein each of the first projections has a collar on a side facing away from the body; and
 wherein a longitudinal axis of each collar is substantially perpendicular to a longitudinal axis of a corresponding first projection.

4. The holder of claim 1, wherein a cross-section of each first projection has a shape that corresponds to a shape of a coil body.

5. The holder of claim 1, wherein each first projection has a groove for guiding a wire end.

6. The holder of claim 1, wherein a top edge of each first projection is substantially parallel to a top side of the body.

7. The holder of claim 1, wherein ends of the slots extend beyond bottom edges of the first projections or the second projections.

8. An apparatus comprising:
 a holder for holding an electrical component comprising wire ends that act as electrical connections, the holder comprising:
  a body comprising a center part, the center part comprising a recess for holding the electrical component, the recess comprising side walls, the side walls comprising slots for guiding wire ends of the electrical component;
  first projections for winding wire ends, the first projections being on side surfaces of the body; and
  second projections on the body between the slots and the first projections, the second projections for guiding wire ends of the electrical component;
  wherein the recess and the slots are open at a same side of the body; and
  wherein the body comprises a base, the base being an undivided part of the body and being on a different side of the body than the recess and the slots; and
 the electrical component;
 wherein the electrical component does not extend beyond a top edge of the recess.

9. The apparatus of claim 8,
 wherein a second projection is configured to guide a wire end of the electrical component between a slot and a first projection corresponding to the slot, the second projection for guiding the wire end substantially parallel to a base surface of the body.

10. The apparatus of claim 8,
 wherein the second projections are configured to hinder upward slippage of the wire ends.

11. The apparatus of claim 8, wherein each first projection comprises a groove for guiding a wire end; and
 wherein a position of a first projection and a depth of a groove for the first projection are such that a top edge of a wire end extends beyond a top surface of the body and forms a contact for use in surface mounting the electrical component.

12. The apparatus of claim 8, wherein the electrical component comprises a toroidal-core inductor comprising a wire winding; and
 wherein the wire ends comprise ends of the wire winding of the toroidal-core inductor.

13. The apparatus of claim 12, wherein the electrical component comprises a toroidal-core inductor comprising a closed magnetic core and two different wire windings.

14. The holder of claim 2, wherein each of the first projections has a collar on a side facing away from the body; and
 wherein a longitudinal axis of each collar is substantially perpendicular to a longitudinal axis of a corresponding first projection.

15. The holder of claim 14, wherein first projections on different sides of the body have mirror-image constructions.

16. The holder of claim 15, wherein each first projection has a groove for guiding a wire end.

17. The holder of claim 16, wherein a top edge of each first projection is substantially parallel to a top side of the body.

* * * * *